US009515251B2

(12) United States Patent
Annunziata et al.

(10) Patent No.: US 9,515,251 B2
(45) Date of Patent: Dec. 6, 2016

(54) STRUCTURE FOR THERMALLY ASSISTED MRAM

(71) Applicants: International Business Machines Corporation, Armonk, NY (US); Crocus Technology SA, Grenoble (FR)

(72) Inventors: Anthony J. Annunziata, Stamford, CT (US); Lucian Prejbeanu, Grenoble (FR); Philip L. Trouilloud, Norwood, NY (US); Daniel C. Worledge, Cortlandt Manor, NY (US)

(73) Assignees: INTERNATIONAL BUSINESS MACHINES CORPORATION, Armonk, NY (US); CROCUS TECHNOLOGY SA, Grenoble (FR)

( * ) Notice: Subject to any disclaimer, the term of this patent is extended or adjusted under 35 U.S.C. 154(b) by 66 days.

(21) Appl. No.: 14/583,997

(22) Filed: Dec. 29, 2014

(65) Prior Publication Data
US 2015/0295165 A1 Oct. 15, 2015

Related U.S. Application Data

(60) Provisional application No. 61/977,232, filed on Apr. 9, 2014.

(51) Int. Cl.
*H01L 43/08* (2006.01)
*H01L 43/12* (2006.01)
(Continued)

(52) U.S. Cl.
CPC ............. *H01L 43/08* (2013.01); *G01R 33/066* (2013.01); *G11C 11/161* (2013.01);
(Continued)

(58) Field of Classification Search
CPC ............ H01L 27/222–27/228; G11C 14/0036; G11C 14/0081; G11C 11/161; G11C 11/5607; G01R 33/066
(Continued)

(56) References Cited

U.S. PATENT DOCUMENTS 5,005,102 A 4/1991 Larson
5,790,366 A 8/1998 Desu et al.
(Continued)

OTHER PUBLICATIONS

List of IBM Patent or Patent Applications Treated as Related; Mar. 19, 2015; pp. 1-2.
(Continued)

*Primary Examiner* — Kenneth Parker
*Assistant Examiner* — Bo Fan
(74) *Attorney, Agent, or Firm* — Cantor Colburn LLP; Vazken Alexanian

(57) ABSTRACT

A mechanism is provided for fabricating a thermally assisted magnetoresistive random access memory device. A bottom thermal barrier is formed on a bottom contact. A magnetic tunnel junction is formed on the bottom thermal barrier. The magnetic tunnel junction includes a top ferromagnetic layer formed on a tunnel barrier. The tunnel barrier is formed on a bottom ferromagnetic layer. A top thermal barrier is formed on the top ferromagnetic layer. A top contact is formed on the top thermal barrier. The top contact is reduced to a first diameter. The tunnel barrier and the bottom ferromagnetic layer each have a second diameter. The first diameter of the top contact is smaller than the second diameter.

16 Claims, 12 Drawing Sheets

(51) Int. Cl.
*H01L 27/22* (2006.01)
*G11C 14/00* (2006.01)
*G11C 11/56* (2006.01)
*H01L 29/82* (2006.01)
*G11C 11/16* (2006.01)
*G01R 33/06* (2006.01)

(52) U.S. Cl.
CPC ...... *G11C 11/5607* (2013.01); *G11C 14/0036* (2013.01); *G11C 14/0081* (2013.01); *H01L 27/222* (2013.01); *H01L 27/226* (2013.01); *H01L 27/228* (2013.01); *H01L 29/82* (2013.01); *H01L 43/12* (2013.01)

(58) Field of Classification Search
USPC ......... 257/421; 365/173, 158; 438/3; 360/59
See application file for complete search history.

(56) References Cited

U.S. PATENT DOCUMENTS

| | | | |
|---|---|---|---|
| 6,420,740 | B1 | 7/2002 | Zhang et al. |
| 6,759,250 | B2 | 7/2004 | Zhang et al. |
| 6,911,685 | B2 | 6/2005 | Anthony et al. |
| 7,038,263 | B2 | 5/2006 | Yang et al. |
| 7,126,201 | B2 | 10/2006 | Matsutera et al. |
| 7,270,848 | B2 | 9/2007 | Suzuki et al. |
| 7,397,074 | B2 | 7/2008 | Nickel |
| 7,443,639 | B2 | 10/2008 | Parkin |
| 7,714,315 | B2 | 5/2010 | Happ et al. |
| 7,855,435 | B2 | 12/2010 | Klostermann et al. |
| 8,084,760 | B2 | 12/2011 | Lung et al. |
| 8,094,421 | B2 | 1/2012 | Lin |
| 8,344,438 | B2 | 1/2013 | Schroeder et al. |
| 2004/0171217 | A1 | 9/2004 | Chung et al. |
| 2004/0171272 | A1 | 9/2004 | Jin et al. |
| 2007/0158632 | A1 | 7/2007 | Ho |
| 2008/0247072 | A1* | 10/2008 | Nozieres ................ G11C 11/16 360/59 |
| 2011/0007561 | A1 | 1/2011 | Berger et al. |
| 2011/0147866 | A1 | 6/2011 | Sun et al. |
| 2012/0106245 | A1* | 5/2012 | Mackay ................ G11C 11/16 365/173 |
| 2012/0243291 | A1 | 9/2012 | Gopalakrishnan |
| 2012/0326250 | A1* | 12/2012 | Gaidis .................... H01L 43/08 257/421 |
| 2013/0044532 | A1 | 2/2013 | Bethune et al. |
| 2013/0083593 | A1 | 4/2013 | Prejbeanu et al. |
| 2014/0034891 | A1 | 2/2014 | Wang et al. |
| 2016/0043303 | A1 | 2/2016 | Annunziata et al. |
| 2016/0043309 | A1 | 2/2016 | Annunziata et al. |

OTHER PUBLICATIONS

List of IBM Patents or Patent Applications Treated as Related—Date Filed: Jun. 2, 2016 1 page.

Dieny, B., et al., "Extended Scalability and Functionalities of MRAM Based on Thermally Assisted Writing," 2011 IEEE International Electron Devices Meeting (IEDM), 2011, 3 pages.

J. G. Deak et al., "Effect of Resistance-Area-Product and Thermal Environment on Writing of Magneto-Thermal MRAM," IEEE Transactions on Magnetics, vol. 42, Issue 10, Oct. 2006, pp. 2721-2723.

J. Wang et al., "Low-current blocking temperature writing of double barrier magnetic random access memory cells," Appl. Phys. Lett., vol. 84, 2004, pp. 945-947.

Prejbeanu, L., et al., Thermally Assisted MRAMs: Ultimate Scalability and Logic Functionalities, Journal of Physics D: Applied Physics, vol. 46, No. 7, 2013, 074002, 16 pages.

S. Cardoso, et al., "Double-Barrier Magnetic Tunnel Junctions with GeSbTe Thermal Barriers for Improved Thermally Assisted Magnetoresistive Random Access Memory Cells," Journal of Applied Physics, vol. 99, 2006, pp. 08N901-1 to 08N901-3.

List of IBM Patent or Patent Applications Treated as Related; Mar. 18, 2015; pp. 1-2.

* cited by examiner

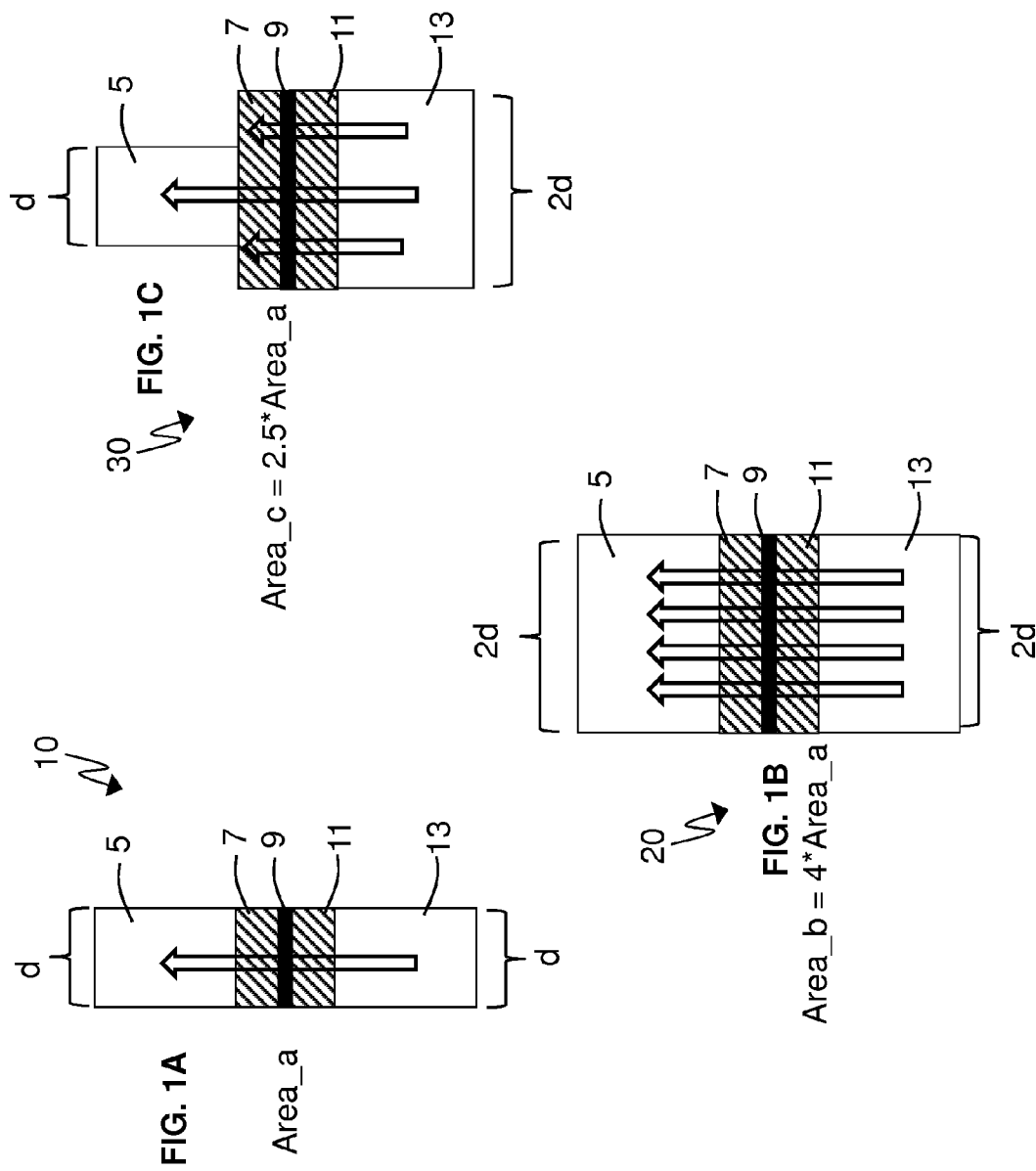

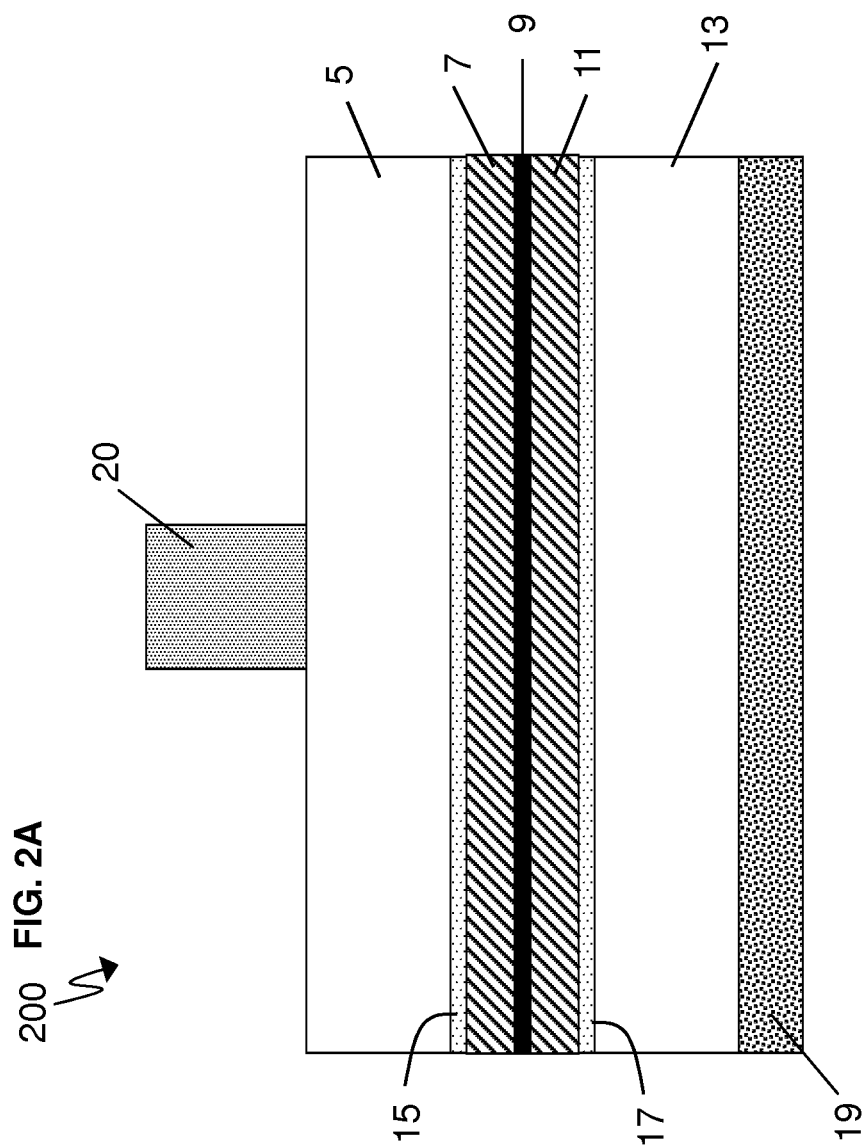

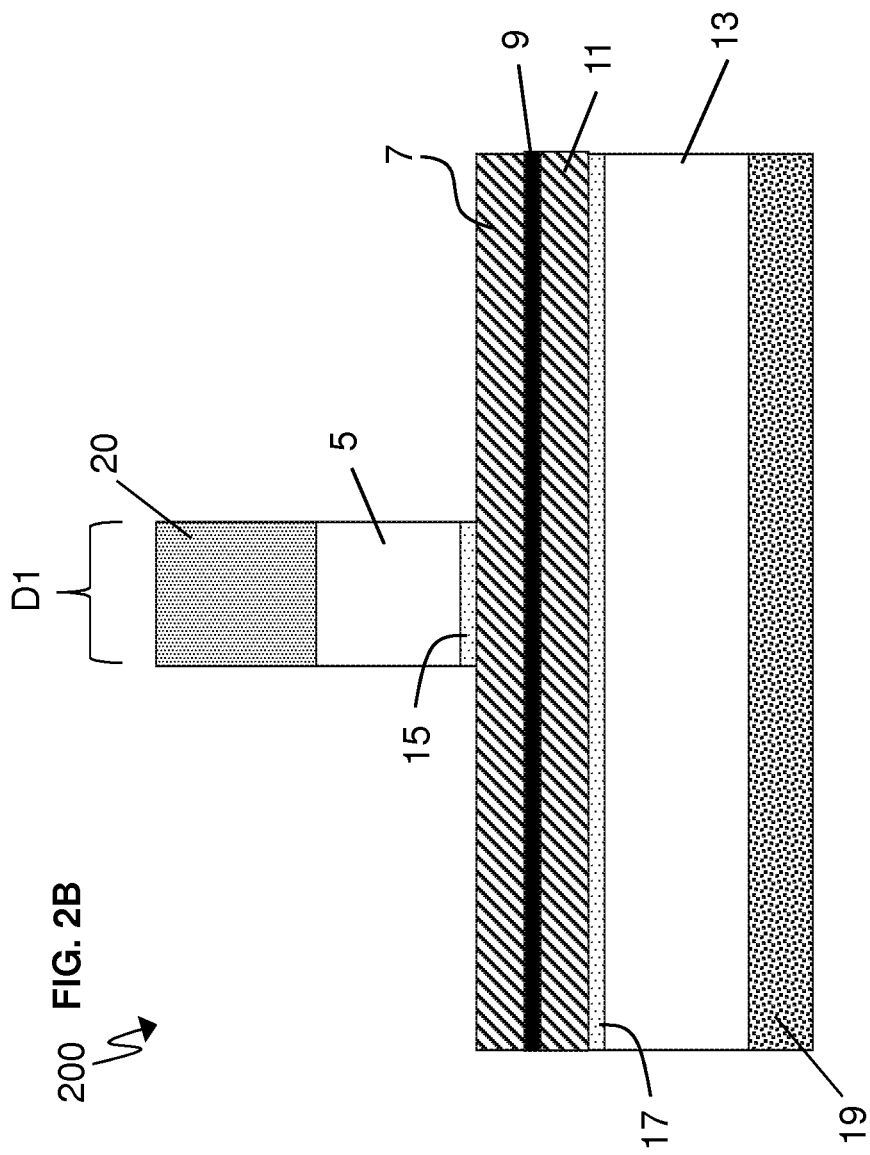

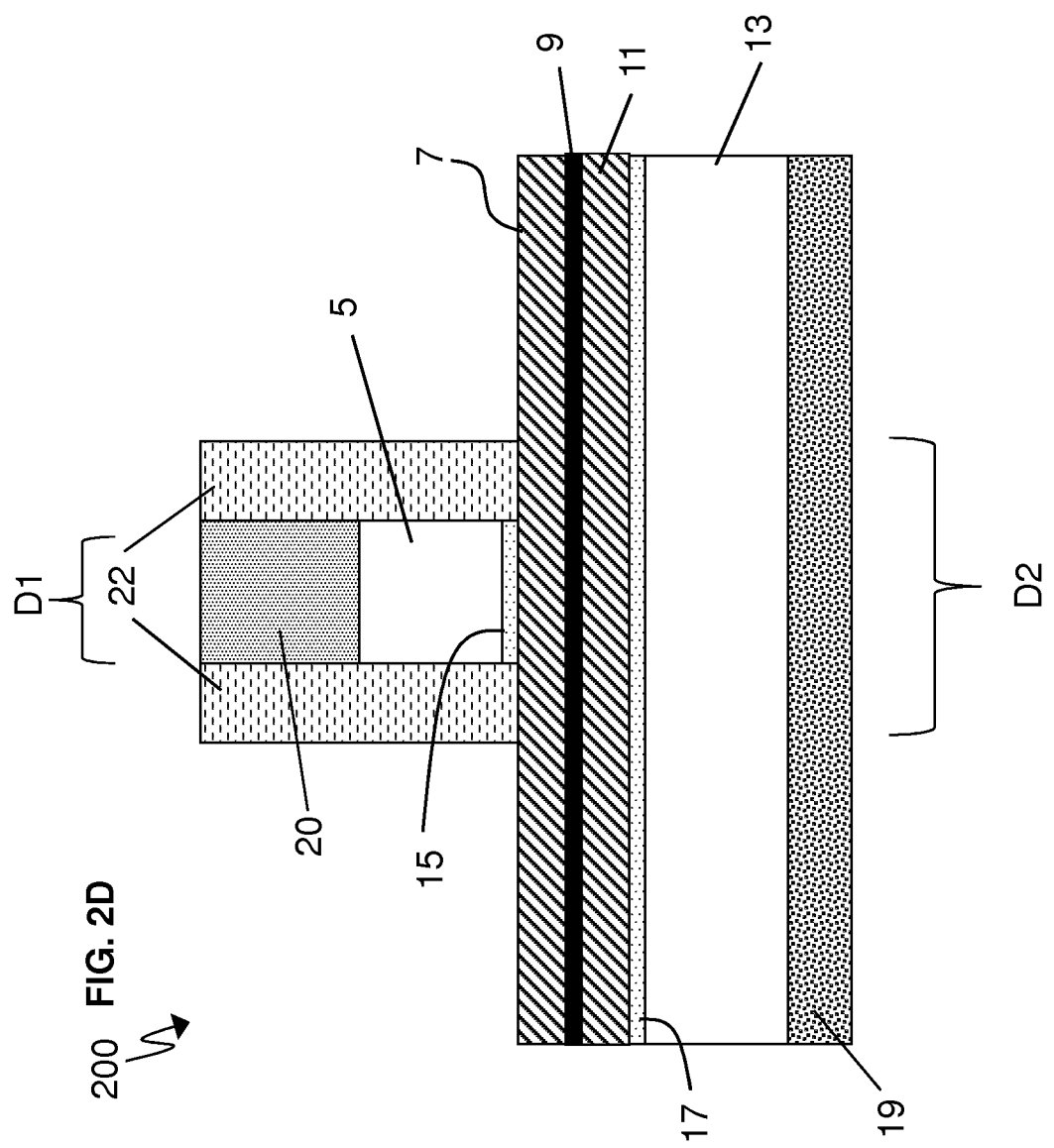

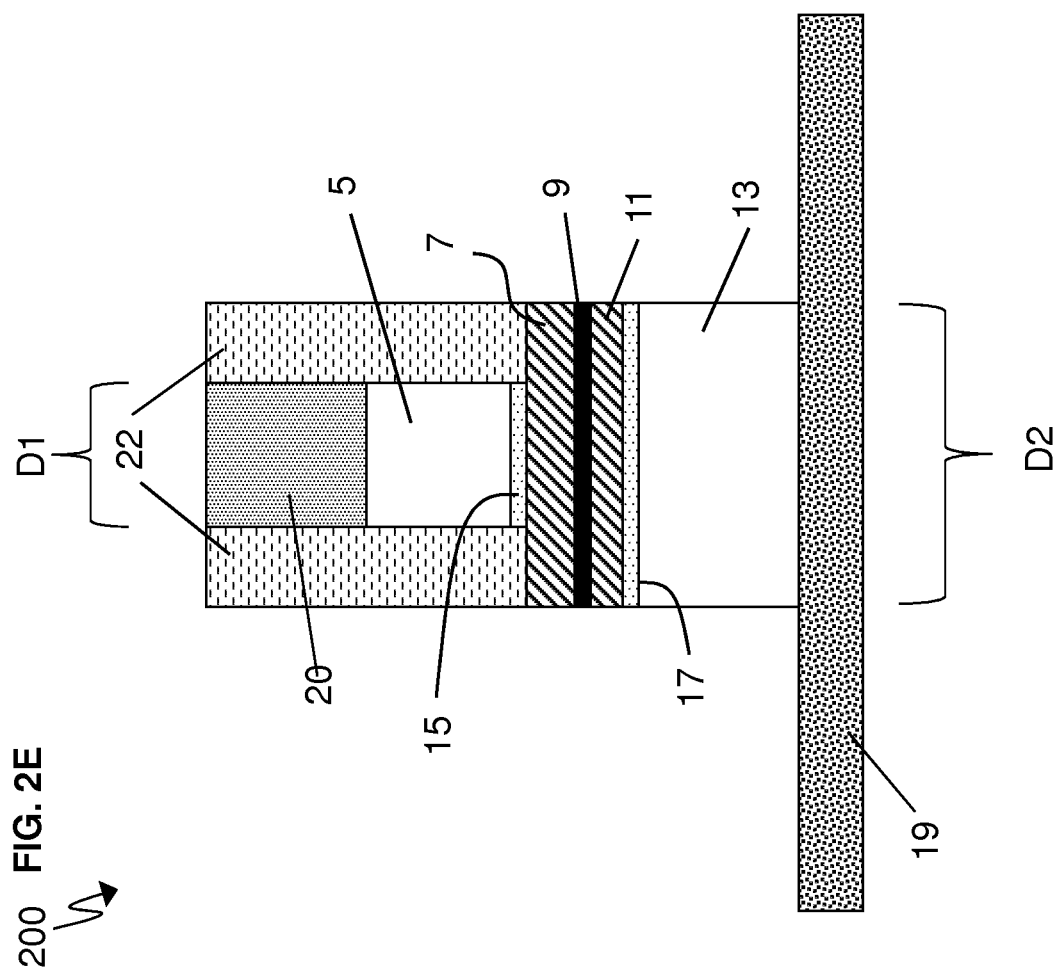

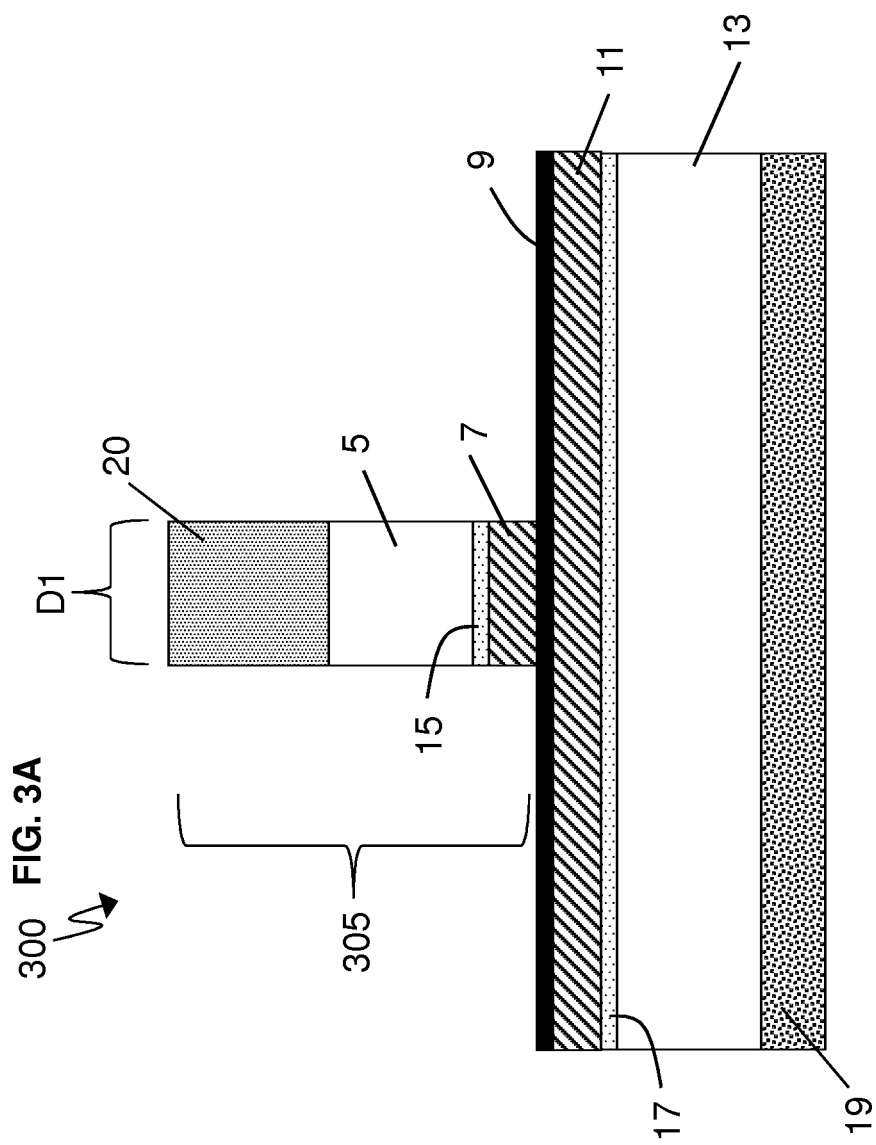

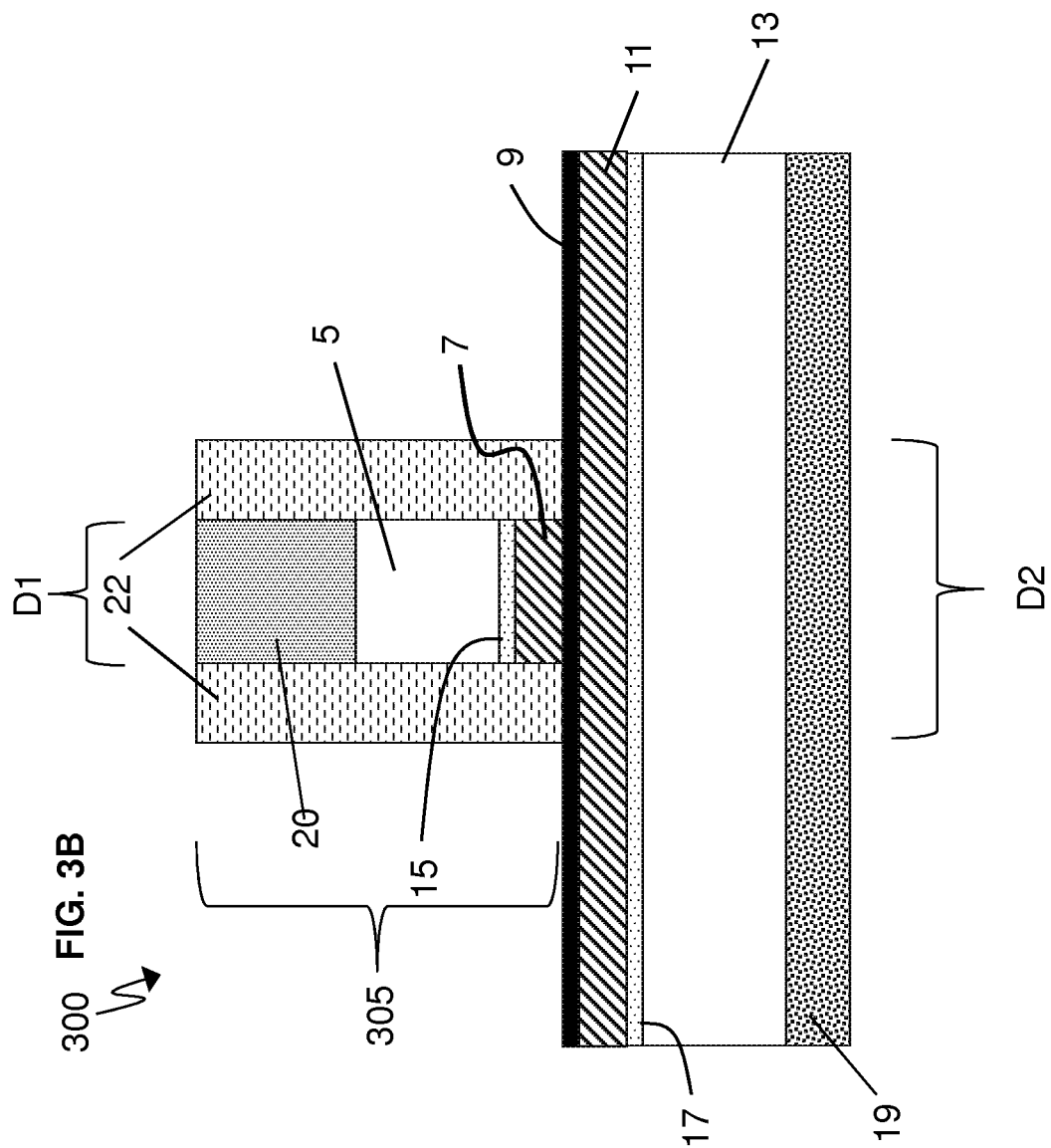

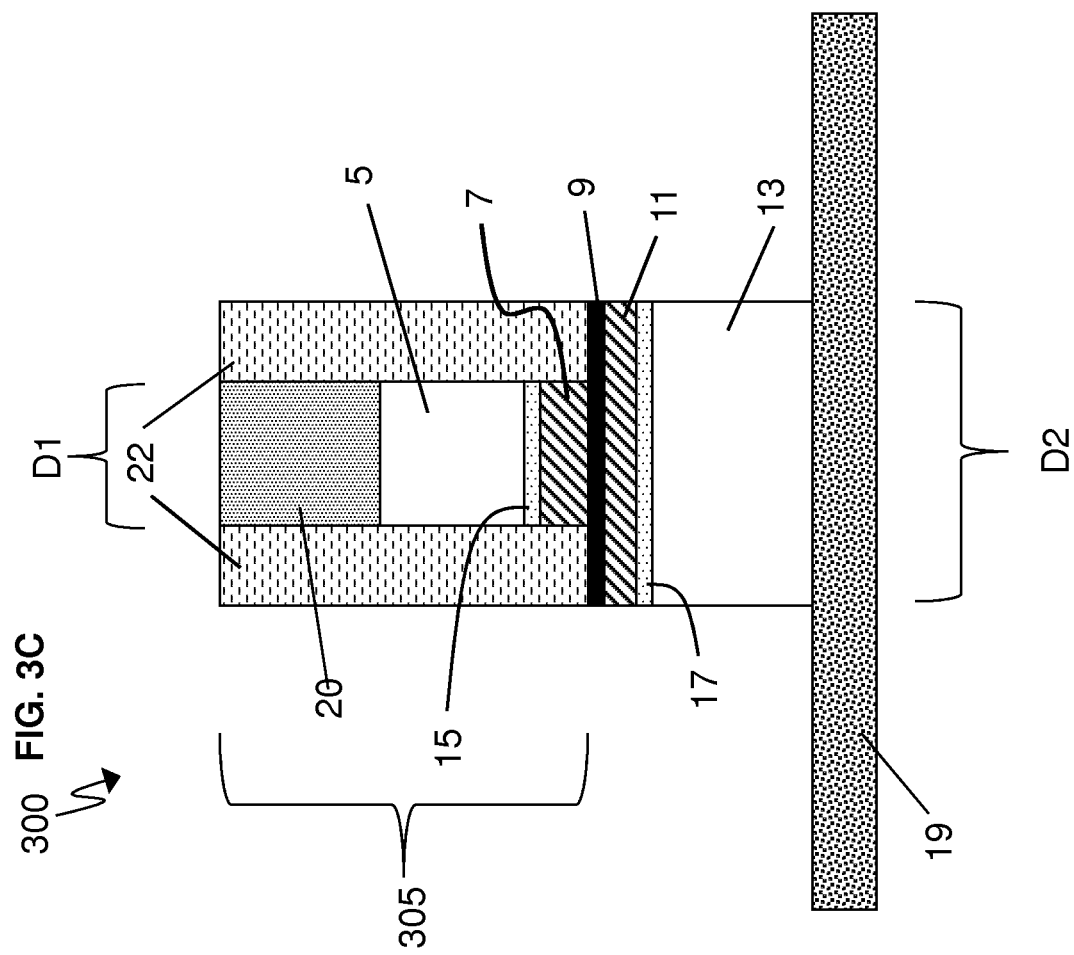

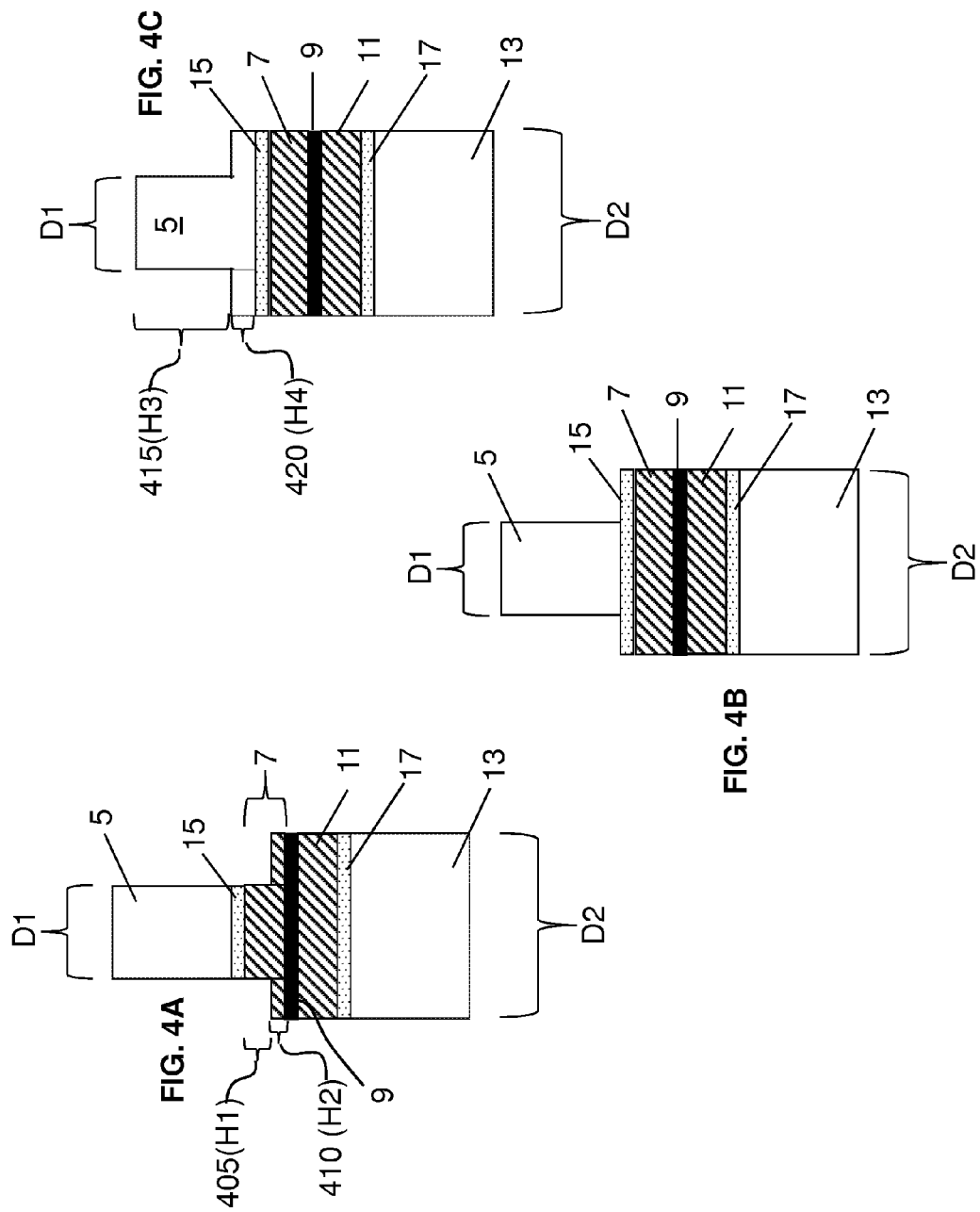

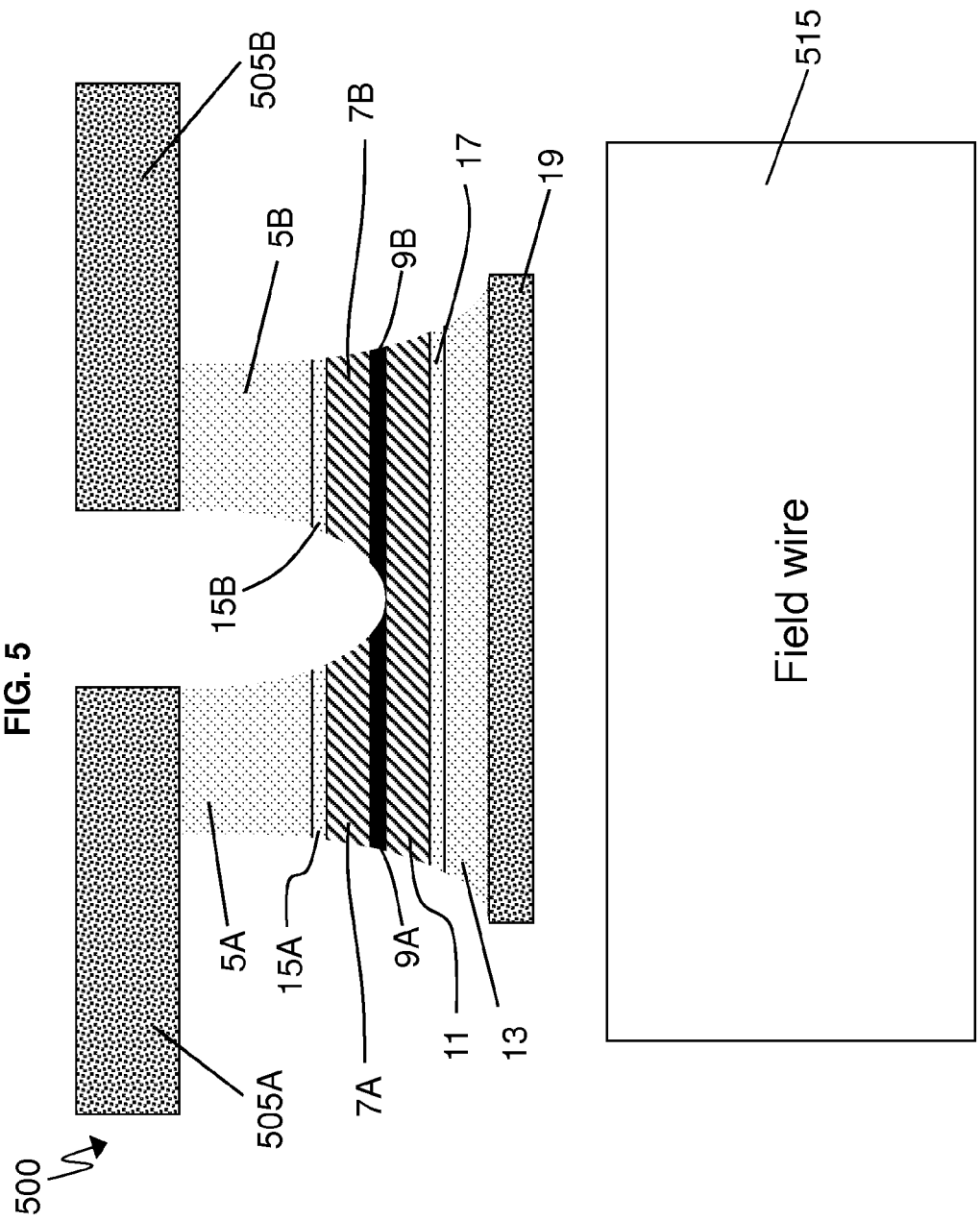

STRUCTURE FOR THERMALLY ASSISTED MRAM

This application claims priority to Provisional Application No. 61/977,232, filed on Apr. 9, 2014, which is herein incorporated by reference in its entirety.

BACKGROUND

The present invention relates generally to magnetic memory devices, and more specifically, to thermally assisted MRAM devices that have a reduction in width/diameter above the tunnel barrier.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic moment, separated by a thin insulating layer. In a typical embodiment, one of the two plates is a reference magnet with magnetization set to a particular polarity; the other plate's magnetization can be changed to match that of an external field to store memory and is termed the "free magnet" or "free-layer". This configuration is known as a magnetic tunnel junction and is the simplest structure for a MRAM bit. A memory device is built from a grid of such "cells." In some configurations of MRAM, such as the type further discussed herein, both the reference and free layers of the magnetic tunnel junctions can be switched using an external magnetic field.

SUMMARY

According to one embodiment, a method of fabricating a thermally assisted magnetoresistive random access memory device (TAS-MRAM) is provided. The method includes forming a bottom contact, forming a bottom thermal barrier on the bottom contact, and forming a magnetic tunnel junction on the bottom thermal barrier. The magnetic tunnel junction includes a top ferromagnetic layer formed on a tunnel barrier, where the tunnel barrier is formed on a bottom ferromagnetic layer. The method includes forming a top thermal barrier on the top ferromagnetic layer, forming a top contact on the top thermal barrier, and reducing the top contact to a first diameter. The tunnel barrier and the bottom ferromagnetic layer each have a second diameter, and the first diameter of the top contact is smaller than the second diameter.

According to one embodiment, a thermally assisted magnetoresistive random access memory device (TAS-MRAM) is provided. The device includes a bottom thermal barrier formed on a bottom contact, and a magnetic tunnel junction formed on the bottom thermal barrier. The magnetic tunnel junction includes a top ferromagnetic layer formed on a tunnel barrier, where the tunnel barrier is formed on a bottom ferromagnetic layer. A top thermal barrier is formed on the top ferromagnetic layer, and a top contact is formed on the top thermal barrier. The top contact is reduced to a first diameter. The tunnel barrier and the bottom ferromagnetic layer each have a second diameter, and the first diameter of the top contact is smaller than the second diameter.

According to one embodiment, a thermally assisted magnetoresistive random access memory device (TAS-MRAM) is provided. The device includes a bottom thermal barrier formed on a bottom contact, a bottom ferromagnetic layer formed on the bottom thermal barrier, a left tunnel barrier and a right tunnel barrier both formed on the bottom ferromagnetic layer, and a left top ferromagnetic layer formed on the left tunnel barrier. The device also includes a right top ferromagnetic layer formed on the right tunnel barrier, a left top thermal barrier formed on the left top ferromagnetic layer, a right top thermal barrier formed on the right top ferromagnetic layer, a left top contact formed on the left top ferromagnetic layer, and a right top contact formed on the right top ferromagnetic layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1A illustrates a thermally-assisted magnetoresistive random access memory (TAS-MRAM) device.

FIG. 1B illustrates a thermally-assisted magnetoresistive random access memory (TAS-MRAM) device.

FIG. 1C illustrates a thermally-assisted magnetoresistive random access memory (TAS-MRAM) device according to an embodiment.

FIGS. 2A through 2E illustrate a fabrication process to form a thermally-assisted magnetoresistive random access memory (TAS-MRAM) device according to an embodiment, which includes:

FIG. 2A illustrating layers of the MRAM device;

FIG. 2B illustrating etching the top contact;

FIG. 2C illustrating depositing conformal encapsulating layers;

FIG. 2D illustrating directional etching to remove the conformal encapsulating from the horizontal surfaces but not vertical surfaces; and FIG. 2E illustrating completion of the MRAM device.

FIGS. 3A, 3B, and 3C illustrate a fabrication process to form a thermally-assisted magnetoresistive random access memory device according to an embodiment, which includes:

FIG. 3A illustrating etching the top contact, top thermal barrier, and the top ferromagnetic layer;

FIG. 3B illustrating directional etching to remove the conformal encapsulating from the horizontal surfaces but not the vertical surfaces; and FIG. 3C illustrating completion of the MRAM device.

FIG. 4A illustrates a thermally-assisted magnetoresistive random access memory device according to an embodiment.

FIG. 4B illustrates a thermally-assisted magnetoresistive random access memory device according to an embodiment.

FIG. 4C illustrates a thermally-assisted magnetoresistive random access memory device according to an embodiment.

FIG. 5 illustrates a thermally-assisted magnetoresistive random access memory device according to an embodiment.

DETAILED DESCRIPTION

Figure 2C:
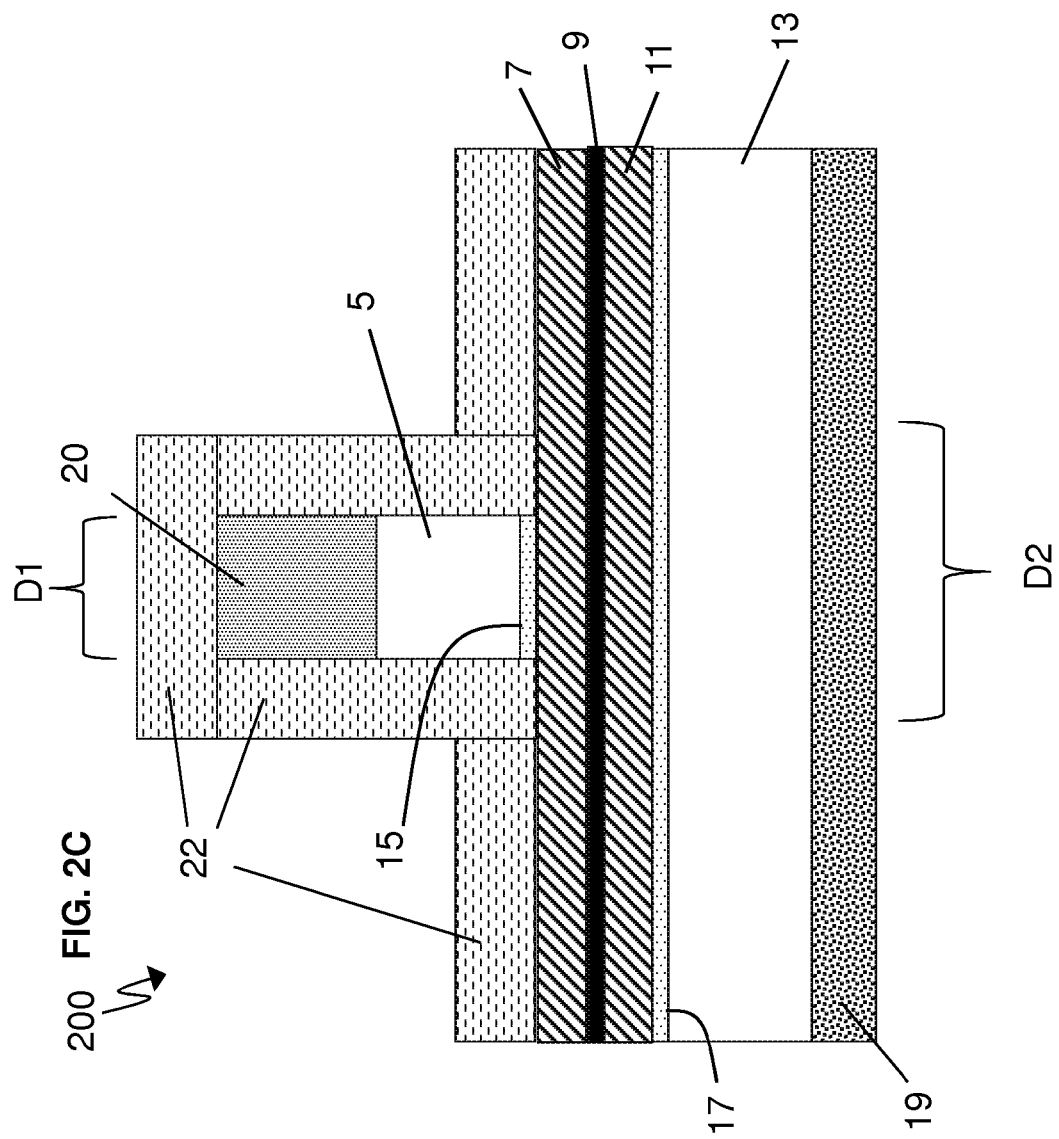

Embodiments relate to thermally-assisted magnetoresistive random access memory (MRAM) devices that use a self-reference read-out scheme. When writing, current (i.e., heating current) flows though the MRAM device to heat it up above a blocking temperature, and at the same time current flows through a neighboring (field) wire to generate a magnetic field that sets the desired orientation of the storage layer. Smaller devices (e.g., in width and/or diameter) require less current to heat the MRAM device but a larger (magnitude) magnetic field and therefore larger current to generate the magnetic field.

The MRAM device must have high enough of a resistance to be compatible with the select transistor, which limits how large the storage layer can be made. The select transistor is used as a switch to turn on and off the writing (heating) current for the MRAM device.

The MRAM device is usually manufactured to have the same diameter for the various layers. However, by stopping the device etch close to the active tunnel barrier, the storage layer can be kept large, while the thermal volume is reduced and the device resistance increased according to embodiments.

Embodiments disclose a fabrication process in which the etch process is interrupted to define an MRAM device with two diameters: one large diameter for the storage layer, one smaller diameter (of various layers above the tunnel barrier) for the current flow. In one implementation, the first etch stops on the tunnel barrier, then a conformal encapsulation layer is applied, and finally a directional etch is applied to complete the etching.

Further details regarding writing to the TAS-MRAM device include heating the magnetic tunnel junction (MTJ) stack to a write temperature ($T_{write}$) higher than the maximum storage temperature ($T_{store}$) in order to write to the device. The (MTJ of the) device consists of a storage magnetic layer, and a sense magnetic layer, separated by a non-magnetic tunnel barrier. The electrical resistance of this stack depends on the relative magnetic orientation of the parts of the storage and sense layers that interface with the tunnel barrier; this effect is caused by the phenomenon of tunneling magnetoresistance (TMR). In typical devices, an antiferromagnetic layer pins the storage layer at temperatures $T_{MRAM} < T_{store}$, where $T_{MRAM}$ is defined as the temperature of the magnetic tunnel junction (and antiferromagnetic layers). The sense magnetic layer is free to switch back and forth by an applied magnetic field. If the magnetic orientation of the sense layer is parallel to the magnetic orientation of the storage layer, then the MTJ stack will have low resistance; if the sense layer is anti-parallel to the storage layer, the stack will have high resistance. The device is read out by toggling the sense layer in both directions by an applied magnetic field of two known directions, and determining the direction of the storage layer based on the sign of the resistance change.

The MRAM device is written when the temperature of the MRAM device is $T_{MRAM} \geq T_{write}$; in this case, the pinning by the antiferromagnet is reduced and the storage layer can be re-oriented into a new direction by an applied magnetic field of known direction. One direction is chosen as a logical "1" state, while the other is chosen as a logical "0" state.

The storage layer may consist of a single magnetic layer, or a synthetic antiferromagnetic layer; each of these magnetic layers may in turn consist of several distinct, alloy, or compound materials and material layers.

FIGS. 1A, 1B, and 1C (generally referred to as FIG. 1) illustrate a comparison of structures for thermally-assisted magnetoresistive random access memory (TAS-MRAM) devices according to an embodiment. FIG. 1 depicts cross-sectional views of the MRAM devices.

FIG. 1A illustrates a narrow device 10. FIG. 1B illustrates a wide device 20. FIG. 1C illustrates the stop above barrier device 30 according to an embodiment. In each case, each of the MRAM devices has identical layers except their diameters (i.e., widths) are different. Each MRAM device has a top contact 5 which may be a metal contact (or conductor), a ferromagnetic sense layer 7 (also referred to as the free layer), an active tunnel barrier 9 (also referred to as a heating barrier), a ferromagnetic storage layer 11, and a bottom contact 13 which may be a metal contact (or conductor). The difference between the structures is the diameter (d) of the MRAM device in FIGS. 1A, 1B, and 1C.

To simplify, it is assumed that the thermal loss is proportional to the cross-sectional area of the pillar on both sides (above and below) of the tunnel barrier 9. Voltage is fixed, and the current is selected to generate enough thermal power to balance the loss. The current needed is proportional to the cross-sectional areas of contact 5 and 13, while the resistance is defined by the black (active) tunnel barrier 9.

The narrow device 10 has a thermal loss area designated as Area_a. The wide device 20 has a thermal loss area Area_b=4·(Area_a). The (etching) stop above barrier device 30 has a thermal loss area Area_c=2.5·(Area_a).

The advantage of the wide device 20 and (stop over barrier) device 30 over the narrow device 10 is that the storage and free layers 11 and 7 are twice as large and require about half the magnitude of magnetic field to write and read. The current of the wide device 20 is defined by: I_b=4*I_a (R is 4× (i.e., 4 times) smaller than A, the transistor width 4× larger, and same RA), where R is resistance, A is area of the particular device, and I_a is the current of the device 10 in FIG. 1A.

The current of the stop over barrier device 30 is defined by: I_c=2.5*I_a (R is 2.5× smaller than A, the select transistor width 2.5× larger, RA=4/2.5=1.6 times larger). Note that the select transistor is not shown but the width of the select transistor is based on the amount of heating current needed, which is I_c in FIG. 1C.

If the larger size of wide device 20 is necessary to reduce the magnitude of the magnetic fields, trimming the top contact 5 reduces the required thermal power (i.e., I_c). Comparing the stop over barrier device 30 to the wide device 20, the device resistance is larger by 4/2.5=1.6, and the circuit size of device 30 can be reduced by 1.6×. Also, RA is also larger by 1.6×. That is, FIG. 1C requires less writing (heating) current than FIG. 1B, and less magnitude of the magnetic field (i.e., field current) than FIG. 1A. In addition, the barrier is more robust because of the larger RA. Note than other examples of the stop over barrier device are provided herein.

FIGS. 2A through 2E (generally referred to as FIG. 2) illustrate a fabrication process for a thermally-assisted magnetoresistive random access memory (TAS-MRAM) device 200 according to an embodiment. Various cross-sectional views are shown for making the MRAM device 200. FIG. 2 illustrates one example of a stop on or above the barrier device. One skilled in the art understands that other embodiments discussed herein can be made according to the example below.

FIG. 2A illustrates that a bottom electrode 19 is formed and the bottom contact 13 is deposited on top of the bottom electrode 19. The bottom electrode 19 and the bottom contact 13 may both be a metal or any suitable conductor. A thermal barrier 17 is deposited on top of the bottom contact 13. The ferromagnetic storage layer 11 is deposited on the bottom thermal barrier 17. The (active) tunnel barrier 9 (which has TMR necessary to read out the MRAM device 200) is deposited on the ferromagnetic storage layer 11. The ferromagnetic sense layer 7 is deposited on the tunnel barrier 9. A top thermal barrier 15 is deposited on the ferromagnetic sense layer 7. The top contact 5 is deposited on the top thermal barrier 15.

Example materials of the thermal barriers 15 and 17 include BiTe, GeSbTe, and SiCOH. When electrical (writing) current is applied to heat the tunnel barrier 9, the thermal barriers 15 and 17 help to maintain heat in between thermal barriers 15 and 17, thus preventing heat loss. The material of the tunnel barrier 9 may include MgO.

Example ferromagnetic materials of the ferromagnetic sense layer 7 and ferromagnetic storage layer 11 include Co, Fe, and/or Ni, along with any alloy of these materials.

A photoresist layer 20 is deposited on the top contact 5. The photoresist layer 20 is patterned in the desired width (diameter) for the shaping the top contact 5 (and top thermal barrier 15) below. (Note that the diameter of the photoresist layer 20 is utilized for etching other layers as discussed in other embodiments). FIG. 2B illustrates etching the top contact 5 and the top thermal barrier 15 into the corresponding/matching diameter of the photoresist 20 above. In this implementation the depth of etching is through the top thermal barrier 15. This implementation shows that both the top contact 5 and the top thermal barrier 15 have been reduced in diameter.

One implementation may only reduce the diameter of the top contact 5 to the narrow width of the photoresist 20, so that the etching stops at the top thermal barrier 15 but not through the thermal barrier 15 (as shown in FIG. 4B). Another implementation may additionally etch through the ferromagnetic sense layer 7, along with the top contact 5 and the top thermal barrier 15, such that the ferromagnetic sense layer 7 also has the narrow width of the photoresist 20 (as shown in FIG. 3). Etching is to stop above and/or on the tunnel barrier 9, without etching the tunnel barrier 9 to the narrow width of the photoresist layer 20.

FIG. 2C illustrates depositing conformal encapsulating layers 22 (e.g., via spin-on deposition) on all surfaces. FIG. 2D illustrates using directional etching to remove the conformal encapsulating layers 22 from the horizontal surfaces. The conformal encapsulating layers 22 remain vertically around the perimeter of the photoresist 20, top contact 5, and top thermal barrier 15. The conformal encapsulating layers 22 are configured not to conduct electricity. Examples of the conformal encapsulating layers 22 include insulators, such as silicon dioxide, silicon nitride, etc.

FIG. 2E illustrates completing the MRAM device 200 by etching down to the electrode 19. As can be seen, the ferromagnetic sense layer 7, tunnel barrier 9, ferromagnetic storage layer 11, bottom thermal barrier 17, and bottom contact layer 13 are etched to a width/diameter that correspond to (i.e., matches) the combined width of the (left and right) conformal encapsulating layers 22 plus the photoresist 20. The conformal encapsulating layers 22 were added so that the top contact 5 plus conformal encapsulating layers 22 on the left and right have a matching diameter (D2) as the ferromagnetic sense layer 7, tunnel barrier 9, ferromagnetic storage layer 11, bottom thermal barrier 17, and bottom contact layer 13.

For example, the diameter of the top contact 5, the top thermal contact 15, and photoresist 20 are each D1. The example range of diameter D1 may be 25-100 nanometers (nm). Particularly, the diameter D1 may be 25-50 nm which maintains a lower heating current but keeps the magnitude of the magnetic field manageable 50-200 Oersted given the narrowed width of the top contact 5.

The layers (the ferromagnetic sense layer 7, tunnel barrier 9, ferromagnetic storage layer 11, bottom thermal barrier 17, and bottom contact layer 13) below the top thermal contact 15 each have a diameter D2. The diameter D2 may be 200-500 nm. Although ranges are provided for diameters D1 and D2, it is noted that the relationship of the smaller diameter D1 to larger diameter D2 is intended such that diameter D1 is always smaller than diameter D2 by 20 nm or more (particularly 50 nm smaller). In one embodiment, the smaller diameter D1 is configured to be half the diameter D2 for any diameter selected within the range of diameter D1 or diameter D2.

FIGS. 3A, 3B, and 3C (generally referred to as FIG. 3) illustrate a fabrication process for a thermally-assisted magnetoresistive random access memory (TAS-MRAM) device 300 according to an embodiment. Various cross-sectional views are shown for making the MRAM device 300. FIG. 3 illustrates one example of a stop on or above the barrier device that etches through the top ferromagnetic layer, which in this case is the ferromagnetic sense layer 7. In one embodiment, the magnetic tunnel junction (MTJ) may include the ferromagnetic storage layer 11 deposited on top of the tunnel barrier 9, and the tunnel barrier 9 deposited on top of the ferromagnetic sense layer 7. In this embodiment, the etching would extend down through the ferromagnetic storage layer 11 which is now the top ferromagnetic layer in the magnetic tunnel junction.

Referring back to FIG. 3, FIG. 3 includes the same materials (layers) that have been discussed above in FIG. 2, except that instead of only etching through the top contact 5 and top thermal barrier 15 in FIG. 2, FIG. 3 etches the smaller diameter D1 through the top contact 5, top thermal barrier 15, and the top ferromagnetic sense layer 7. For the sake of conciseness, some processes in the fabrication process previously discussed in FIG. 2 are not repeated in FIG. 3 but apply by analogy.

As previously shown in FIG. 2A (but not repeated in FIG. 3), the bottom electrode 19 is formed and the bottom contact 13 is deposited on top of the bottom electrode 19. The bottom electrode 19 and the bottom contact 13 may both be a metal or any suitable conductor. The thermal barrier 17 is deposited on top of the bottom contact 13. The ferromagnetic storage layer 11 is deposited on the bottom thermal barrier 17. The (active) tunnel barrier 9 (which has TMR necessary to read out the MRAM device 200) is deposited on the ferromagnetic storage layer 11. The ferromagnetic sense layer 7 is deposited on the tunnel barrier 9. The top thermal barrier 15 is deposited on the ferromagnetic sense layer 7, and the top contact 5 is deposited on the top thermal barrier 15. The photoresist layer 20 is deposited on the top contact 5. The photoresist layer 20 is patterned in the desired width (diameter) for the shaping the top contact 5, the thermal barrier 15, and the ferromagnetic sense layer 7 below (but not through the tunnel barrier 9). After the process shown in FIG. 2A, the fabrication flows to FIG. 3A.

FIG. 3A illustrates etching the top contact 5, the top thermal barrier 15, and the ferromagnetic sense layer 7 into the matching diameter D1 of the photoresist 20 above. FIG. 3A shows that the top contact 5, the top thermal barrier 15, and the ferromagnetic sense layer 7 (shown as narrowed portion 305) have been narrowed to diameter D1.

As previously shown in FIG. 2C (but not repeated in FIG. 3), conformal encapsulating layers 22 (e.g., via spin-on deposition) is deposited on all surfaces. In FIG. 3, the conformal encapsulating layers 22 is likewise deposited on the tunnel barrier 9 (not shown in FIG. 3B), on the top of the photoresist 20 (not shown in FIG. 3B), and on the left and right sides of the narrowed portion 305. After the process shown in FIG. 2C, FIG. 3B illustrates using directional etching to remove the conformal encapsulating layers 22 from the horizontal surfaces. The conformal encapsulating layers 22 remain on the perimeter of the photoresist 20, top contact 5, top thermal barrier 15, and ferromagnetic sense layer 7. The conformal encapsulating layers 22 are configured not to conduct electricity. Examples of the conformal encapsulating layers 22 include oxides, such as silicon dioxide, etc.

FIG. 3C illustrates completing the MRAM device 300 by etching the remaining layers down to the electrode 19 (but not through). As can be seen, the tunnel barrier 9, ferromagnetic storage layer 11, bottom thermal barrier 17, and bottom contact layer 13 are etched to a width that matches (i.e., is the same as) the combined width of the (left and right) conformal encapsulating layers 22 plus the photoresist 20. The conformal encapsulating layers 22 were added so that the narrowed top contact 5, narrowed thermal barrier 15, the ferromagnetic sense layer 7 plus conformal encapsulating layers 22 on the left and right (together) have a matching diameter D2 as the tunnel barrier 9, ferromagnetic storage layer 11, bottom thermal barrier 17, and bottom contact layer 13.

For example, the diameter of the top contact 5, the top thermal barrier 15, photoresist 20, and ferromagnetic sense layer 7 are each D1. The example range of diameter D1 may be 25-100 nanometers (nm). Particularly, the diameter D1 may be 25-50 nm which maintains a lower heating current but keeps the magnetic field manageable 50-200 Oersted given the narrowed width of the top contact 5, the ferromagnetic sense layer 7.

The layers (tunnel barrier 9, ferromagnetic storage layer 11, bottom thermal barrier 17, and bottom contact layer 13) below the ferromagnetic sense layer 7 each have the diameter D2. The diameter D2 may be 200-500 nm. Although ranges are provided for diameters D1 and D2, it is noted that the relationship of the smaller diameter D1 to larger diameter D2 is intended such that diameter D1 is always smaller than diameter D2 by 20 nm or more (particularly 50 nm smaller). In one embodiment, the smaller diameter D1 is configured to be half the diameter D2 for any diameter selected within the range of diameter D1 or diameter D2.

Now turning to additional embodiments illustrating etching to stop on or above the tunnel barrier 9, FIGS. 4A, 4B, and 4C provide additional examples according to embodiments. Although understood to be incorporated, FIGS. 4A, 4B, and 4C omit the additional layers discussed in FIGS. 2 and 3.

FIG. 4A illustrates etching down through only part of the ferromagnetic sense layer 7 in order to narrow only the upper part but not entirely through the ferromagnetic sense layer 7. This etching results in the ferromagnetic sense layer 7 having an upper part 405 with height H1 and a bottom part 410 with height H2. The heights H1 and H2 may be equal (or nearly equal), the height H1 may be more than height H2, and/or the height H2 may be more than the height H1. Examples of the height H1 may include 0.1-2 nm. Examples of the height H2 may include 0.1-2 nm. Although overlapping or nearly overlapping dimensions may be given, the heights H1 and H2 are utilized to maintain one of the height relationships discussed above. Accordingly, the upper part 405 of the ferromagnetic sense layer 7 has the narrow diameter D1 while the bottom part 410 has the larger diameter D2.

FIG. 4B illustrates etching down only through the top contact 15 but not etching through the thermal barrier 15.

FIG. 4C illustrates etching down through only part of the top contact 5 in order to narrow only the upper part but not entirely through the top contact 5. This etching results in the top contact 5 having an upper part 415 with height H3 and a bottom part 420 with height H4. The heights H3 and H4 may be equal (or nearly equal), the height H3 may be more than height H4, and/or the height H3 may be more than the height H4. Examples of the height H3 may include 1-200 nm. Examples of the height H4 may include 0.1-20 nm. Although overlapping or nearly overlapping dimensions may be given, the heights H3 and H4 are utilized to maintain one of the height relationships discussed above. Accordingly, the upper part 415 of the top contact 5 has the narrow diameter D1 while the bottom part 420 has the larger diameter D2.

Now turning to FIG. 5, another example of a cross-sectional view of a thermally assisted magnetoresistive random access memory device (TAS-MRAM) 500 is provided according to an embodiment. The MRAM device 500 operates as one single MRAM device with series junctions. The MRAM device 500 includes the materials (layers) discussed in FIG. 2, and reference can be made to FIG. 2 for example materials. However, in FIG. 5, left and right upper electrodes 505A and 505B are added.

The bottom electrode 19 is formed and the bottom contact 13 is deposited on top of the bottom electrode 19. The thermal barrier 17 is deposited on top of the bottom contact 13. The ferromagnetic storage layer 11 is deposited on the bottom thermal barrier 17. The (active) tunnel barrier 9 (which has TMR necessary to read out the MRAM device 500) is deposited on the ferromagnetic storage layer 11 and patterned to form left and right tunnel barriers 9A and 9B. In one case, the left and right tunnel barriers 9A and 9B are configured to (partially) touch one another on the ferromagnetic storage layer 11. In another case, the left and right tunnel barrier 9A and 9B are formed to be separate from one another so as not to touch each other on the ferromagnetic storage layer 11. The ferromagnetic sense layer 7 is deposited on the tunnel barrier 9 and etched to have left and right ferromagnetic sense layers 7A and 7B. The top thermal barrier 15 is deposited on the ferromagnetic sense layer 7 and patterned to have top thermal barriers 15A and 15B. The top contact 5 is deposited on the top thermal barrier 15 and patterned to have left and right top contacts 5A and 5B.

Additionally, the top electrodes 505A and 505B are deposited on the top contact 5 and patterned to have left and right parts. A field wire 515 provides the magnetic field when an electrical current is applied through the field wire 515. This same field wire 515 may be utilized to generate the magnetic field in FIGS. 1-6 discussed herein.

The MRAM device 500 shows that directional etching is applied to reduce the diameter of layers in the device. Particularly, etching in the center narrows and forms the two contacts 5A and 5B, the thermal barriers 15A and 15B, ferromagnetic sense layers 7A and 7B, and tunnel barriers 9A and 9B.

During writing or reading operations, current flows from electrode 505A through 5A, 15A, 7A, 9A to layers 11, 17, 13, 19. The current flow across layers 11, 17, 13, 19 and then back up through 9B, 7B, 15B, 5B to electrode 505B. For writing, a larger current is used to heat up the device to $T_{write}$. The storage layer is oriented in a desired direction while the device is allowed to cool down below $T_{store}$. The data is stored in the magnetic orientation of the storage layer. When reading, a smaller current is used to probe the resistance of the device while staying below $T_{store}$. The stored data is revealed by the sign of the resistance change for different orientations of the sense layer.

For illustration purposes, various deposition techniques are discussed below and can be utilized in embodiments, as understood by one of ordinary skill in the art. Thin film deposition is the act of applying a thin film to a surface which is any technique for depositing a thin film of material onto a substrate or onto previously deposited layers. Thin is a relative term, but most deposition techniques control layer thickness within a few tens of nanometers. Molecular beam epitaxy allows a single layer of atoms to be deposited at a time. Deposition techniques fall into two broad categories, depending on whether the process is primarily chemical or physical. Chemical vapor deposition utilizes a fluid precursor that undergoes a chemical change at a solid surface, leaving a solid layer. Chemical deposition is further categorized by the phase of the precursor and examples of chemical deposition include, but are not limited to: plating; chemical solution deposition (CSD) or chemical bath deposition (CBD); spin coating or spin casting; chemical vapor deposition (CVD); plasma enhanced CVD (PECVD); atomic layer deposition (ALD); and so forth.

Physical vapor deposition (PVD) uses mechanical, electromechanical, or thermodynamic means to produce a thin film of solid. Examples of physical deposition include but are not limited to: a thermal evaporator (i.e., molecular beam epitaxy); an electron beam evaporator; sputtering; pulsed laser deposition; cathodic arc physical vapor deposition (arc-PVD); electrohydrodynamic deposition (electrospray deposition); reactive PVD; and so forth.

Figure 6:
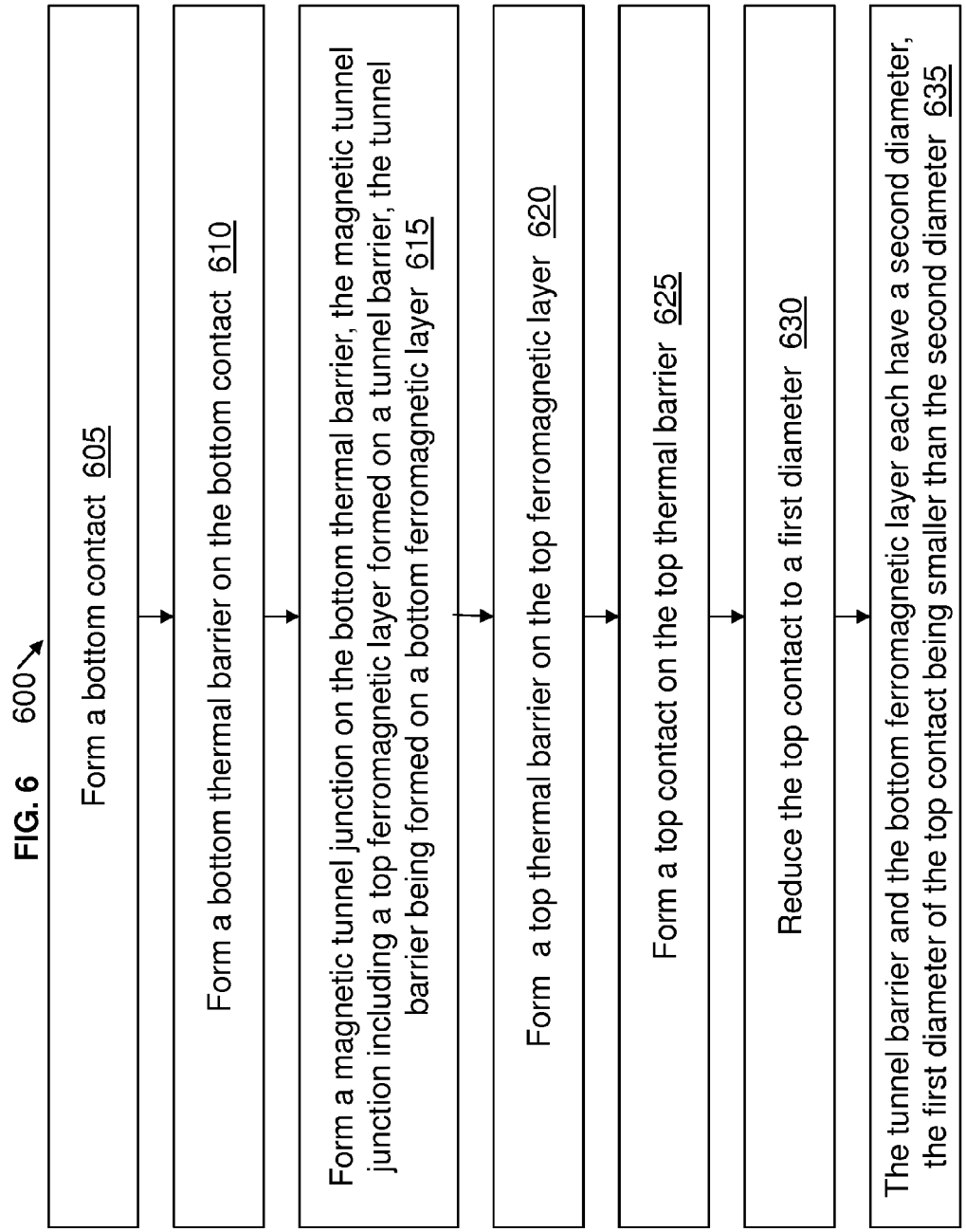
FIG. 6 illustrates a method of fabricating/forming a thermally assisted magnetoresistive random access memory device according to an embodiment.

FIG. 6 illustrates a method 600 of fabricating/forming a thermally assisted magnetoresistive random access memory device (TAS-MRAM) according to an embodiment. Reference can be made to FIGS. 1, 2, 3, and 4 discussed herein.

At block 605, the bottom contact 13 is formed on the electrode 19. The bottom thermal barrier 17 is formed on the bottom contact 13 at block 610.

At block 615, a magnetic tunnel junction is formed on the bottom thermal barrier 17, in which the magnetic tunnel junction includes the top ferromagnetic layer 7 formed on the tunnel barrier 9 and the tunnel barrier 9 formed on bottom ferromagnetic layer 11.

At block 620, the top thermal barrier 15 is formed on the top ferromagnetic layer 7. At block 625, the top contact 5 is formed on the top thermal barrier 15.

At block 630, the diameter of the top contact 5 is reduced (via etching) to a first diameter (e.g., narrow diameter D1). At block 635, the tunnel barrier 9 and the bottom ferromagnetic layer 11 each have a second diameter D2 (e.g., reduced in size by etching), and the first diameter D1 of the top contact 5 is smaller than the second diameter D2. Examples of the first diameter D1 and the second diameter D2 are shown in FIGS. 2, 3, and 4.

The encapsulating conformal layer 22 is formed on the horizontal sides (i.e., perimeter) around the top contact 5, such that a combined diameter of the (left and right sides in cross-sectional view) encapsulating conformal layer 22 and the top contact 5 approximately matches (and/or is) the second diameter D2.

The top thermal barrier 15 is reduced (via etching) to the first diameter D1. The encapsulating conformal layer 22 is formed on horizontal sides around the top thermal barrier 15, such that a combined diameter of the encapsulating conformal layer 22 and the top thermal barrier 15 approximately matches (and/or is) the second diameter D2.

The top ferromagnetic layer 7 is reduced to the first diameter D1 as show in FIG. 3. The encapsulating conformal layer 22 is formed on horizontal sides around the top ferromagnetic layer 7, such that a combined diameter of the encapsulating conformal layer 22 and the top ferromagnetic layer 7 approximately matches (and/or is) the second diameter D2.

The top ferromagnetic layer 7 has the first diameter D1 that is smaller than the second diameter D2 of the tunnel barrier 9 and the bottom ferromagnetic layer 11.

In one implementation, the top ferromagnetic layer may be a ferromagnetic sense layer and the bottom ferromagnetic layer may be a ferromagnetic storage layer, which has been generally described herein. However, examples are not meant to be limited to this implementation, and the ferromagnetic layers may be reversed.

For example, another implementation, the top ferromagnetic layer may be a ferromagnetic storage layer while the bottom ferromagnetic layer may be the ferromagnetic sense layer.

Reducing the top contact 5 to the first diameter D1 may includes reducing the upper part 415 of the top contact 5 to the first diameter D1 while reducing the bottom part 420 of the top contact 5 to the second diameter D2, as shown in FIG. 4C.

The formation of the MRAM device may include reducing an upper part 405 of the top ferromagnetic layer 7 to the first diameter D1 while reducing the bottom part 410 of the top ferromagnetic layer 7 to the second diameter D2, as shown in FIG. 4A.

In FIG. 4, note that the encapsulating conformal layer 22 is not shown on the horizontal sides (i.e., perimeter) around the respective layers that have the narrow diameter D1, so as not to obscure details in FIG. 4. However, as discussed herein, the encapsulating conformal layer 22 is meant and understood to be present around each layer (such as parts/layers 5, 15, 405 and 415) when shown or designated to have the narrow diameter D1 in FIG. 4.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a thermally assisted magnetoresistive random access memory device (TAS-MRAM), the method comprising:
   forming a bottom contact;
   forming a bottom thermal barrier on the bottom contact;
   forming a magnetic tunnel junction on the bottom thermal barrier, the magnetic tunnel junction including a top ferromagnetic layer formed on a tunnel barrier, the tunnel barrier being formed on a bottom ferromagnetic layer;
   forming a top thermal barrier on the top ferromagnetic layer;
   forming a top contact on the top thermal barrier; and
   reducing the top contact to a first diameter;
   wherein the tunnel barrier and the bottom ferromagnetic layer each have a second diameter, the first diameter of the top contact being smaller than the second diameter;
   the method further comprising reducing an upper part of the top ferromagnetic layer to the first diameter while reducing a bottom part of the top ferromagnetic layer to the second diameter.

2. The method of claim 1, further comprising forming an encapsulating conformal layer on horizontal sides around the top contact, such that a combined diameter of the encapsulating conformal layer and the top contact approximately matches the second diameter.

3. The method of claim 1, further comprising reducing the top thermal barrier to the first diameter; and
   forming the encapsulating conformal layer on horizontal sides around the top thermal barrier, such that a combined diameter of the encapsulating conformal layer and the top thermal barrier approximately matches the second diameter.

4. The method of claim 1, further comprising reducing the top ferromagnetic layer to the first diameter; and
   forming the encapsulating conformal layer on horizontal sides around the top ferromagnetic layer, such that a combined diameter of the encapsulating conformal layer and the top ferromagnetic layer approximately matches the second diameter.

5. The method of claim 4, wherein the top ferromagnetic layer has the first diameter that is smaller than the second diameter of the tunnel barrier and the bottom ferromagnetic layer.

6. The method of claim 5, wherein the top ferromagnetic layer is a ferromagnetic sense layer; and
   wherein the bottom ferromagnetic layer is a ferromagnetic storage layer.

7. The method of claim 5, wherein the top ferromagnetic layer is a ferromagnetic storage layer; and
   wherein the bottom ferromagnetic layer is a ferromagnetic sense layer.

8. The method of claim 1, wherein reducing the top contact to the first diameter includes reducing an upper part of the top contact to the first diameter while reducing a bottom part of the top contact to the second diameter.

9. A thermally assisted magnetoresistive random access memory device (TAS-MRAM), the device comprising:
   a bottom thermal barrier formed on a bottom contact;
   a magnetic tunnel junction formed on the bottom thermal barrier, the magnetic tunnel junction including a top ferromagnetic layer formed on a tunnel barrier, the tunnel barrier being formed on a bottom ferromagnetic layer;
   a top thermal barrier formed on the top ferromagnetic layer; and
   a top contact formed on the top thermal barrier;
   wherein the top contact is reduced to a first diameter; and
   wherein the tunnel barrier and the bottom ferromagnetic layer each have a second diameter, the first diameter of the top contact being smaller than the second diameter;
   wherein an upper part of the top ferromagnetic layer is reduced to the first diameter while reducing a bottom part of the top ferromagnetic layer to the second diameter.

10. The device of claim 9, further comprising an encapsulating conformal layer formed on horizontal sides around the top contact, such that a combined diameter of the encapsulating conformal layer and the top contact approximately matches the second diameter.

11. The device of claim 9, wherein the top thermal barrier is reduced to the first diameter; and
    forming the encapsulating conformal layer on horizontal sides around the top thermal barrier, such that a combined diameter of the encapsulating conformal layer and the top thermal barrier approximately matches the second diameter.

12. The device of claim 9, wherein the top ferromagnetic layer is reduced to the first diameter; and
    wherein the encapsulating conformal layer is formed on horizontal sides around the top ferromagnetic layer, such that a combined diameter of the encapsulating conformal layer and the top ferromagnetic layer approximately matches the second diameter.

13. The device of claim 12, wherein the top ferromagnetic layer has the first diameter that is smaller than the second diameter of the tunnel barrier and the bottom ferromagnetic layer.

14. The device of claim 13, wherein the top ferromagnetic layer is a ferromagnetic sense layer; and
    wherein the bottom ferromagnetic layer is a ferromagnetic storage layer.

15. The device of claim 13, wherein the top ferromagnetic layer is a ferromagnetic storage layer; and
    wherein the bottom ferromagnetic layer is a ferromagnetic sense layer.

16. The device of claim 9, wherein reducing the top contact to the first diameter includes reducing an upper part of the top contact to the first diameter while reducing a bottom part of the top contact to the second diameter.

* * * * *